(12) United States Patent
Arai

(10) Patent No.: US 8,700,206 B2
(45) Date of Patent: Apr. 15, 2014

(54) METHOD FOR APPOINTING ORIENTATION FLAT, APPARATUS FOR DETECTING ORIENTATION FLAT, AND PROGRAM FOR APPOINTING ORIENTATION FLAT

(75) Inventor: Kaori Arai, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 528 days.

(21) Appl. No.: 12/749,759

(22) Filed: Mar. 30, 2010

(65) Prior Publication Data

US 2010/0249986 A1 Sep. 30, 2010

(30) Foreign Application Priority Data

Mar. 31, 2009 (JP) ................................. 2009-087695

(51) Int. Cl.
*H01L 21/68* (2006.01)
*G03F 9/00* (2006.01)

(52) U.S. Cl.
USPC ............................ 700/229; 356/401; 356/399

(58) Field of Classification Search
USPC .......................................................... 700/229
See application file for complete search history.

(56) References Cited

U.S. PATENT DOCUMENTS

| | | | | |
|---|---|---|---|---|
| 5,455,679 A | * | 10/1995 | Houryu et al. ................. | 356/401 |
| 5,557,411 A | * | 9/1996 | Houryu et al. ................. | 356/401 |
| 5,982,492 A | * | 11/1999 | Oppenheimer et al. ...... | 356/614 |
| 6,791,686 B1 | * | 9/2004 | Finarov ......................... | 356/399 |
| 7,706,908 B2 | * | 4/2010 | Scholte Van Mast et al. | 700/114 |
| 2006/0169208 A1 | * | 8/2006 | Shinozaki et al. ............ | 118/715 |

FOREIGN PATENT DOCUMENTS

| | | | | |
|---|---|---|---|---|
| JP | 62-206847 A | | 9/1987 | |
| JP | 62206847 A | * | 9/1987 | .............. H01L 21/68 |
| JP | 2-130850 A | | 5/1990 | |
| JP | 04-249339 A | | 9/1992 | |
| JP | 04249339 A | * | 9/1992 | .............. H01L 21/68 |
| JP | 2004-356411 A | | 12/2004 | |
| JP | 2004356411 A | * | 12/2004 | .............. H01L 21/68 |

\* cited by examiner

*Primary Examiner* — Gene Crawford
*Assistant Examiner* — Kyle Logan
(74) *Attorney, Agent, or Firm* — Abelman, Frayne & Schwab

(57) ABSTRACT

Disclosed is a method for appointing an orientation flat, in which when there are a plurality of orientation flats with the same length, any one from among the orientation flats of the same length can be certainly appointed as a reference orientation flat. In the disclosed method, three orientation flats at three positions are detected, respectively, through the rotation of a semiconductor wafer, the lengths of three circular arcs between the three orientation flats are obtained, respectively, and then an orientation flat at the right side of the longest circular arc from among the three circular arcs is appointed as a reference orientation flat. Accordingly, it is possible to certainly appoint a reference orientation flat even though there exist a plurality of circular arcs with the same length.

6 Claims, 7 Drawing Sheets

METHOD FOR APPOINTING ORIENTATION FLAT, APPARATUS FOR DETECTING ORIENTATION FLAT, AND PROGRAM FOR APPOINTING ORIENTATION FLAT

This application is based on and claims priority from Japanese Patent Application No. 2009-087695, filed on Mar. 31, 2009, with the Japanese Patent Office, the disclosure of which is incorporated herein in its entirety by reference.

TECHNICAL FIELD

The present disclosure relates to a method for appointing an orientation flat, an apparatus for detecting an orientation flat, and a program for appointing an orientation flat. More particularly, the present disclosure relates to a method for appointing an orientation flat, an apparatus for detecting an orientation flat, and a program for appointing an orientation flat, in which when pre-alignment is performed on a semiconductor wafer having at least two orientation flats with the same size, a reference orientation flat of the pre-alignment is appointed.

BACKGROUND

In various treatment processes of a semiconductor wafer, a so-called pre-alignment in which the semiconductor wafer is aligned in a certain direction is performed. In the pre-alignment of the semiconductor wafer, an orientation flat formed at the outer circumference of the semiconductor wafer is used. However, some semiconductor wafers have a plurality of orientation flats.

For example, Japanese Laid-Open Patent Publication No. HEI 02-130850 discloses a technology of providing an additional orientation flat (sub orientation flat) as well as a primary orientation flat (main orientation flat) and thereby using the sub orientation flat as a marker for distinguishing between front and rear surfaces of a semiconductor wafer. In this technology, before a semiconductor wafer is cut off from an ingot, a spiral sub-notch, aside from a main notch for an orientation flat, is provided on the outer circumferential surface of the ingot. Thus, according to the distance from a main orientation flat to a sub orientation flat formed by cutting a semiconductor wafer, the cut-off order from a seed side is identified, thereby distinguishing the front and rear surfaces of the semiconductor wafer. In this technology, it is possible to clearly distinguish the main orientation flat from the sub orientation flat according to their sizes.

Also, the Japanese Laid-Open Patent Publication No. 2004-356411 discloses a technology of distinguishing between front and rear surfaces of a semiconductor wafer by using a main orientation flat and two sub orientation flats. In this technology, a main orientation flat is imaged by two imaging means, and one sub orientation flat or a circular arc portion opposite to the sub orientation flat is imaged by one imaging means, while the front and rear surfaces of the semiconductor wafer are distinguished from each other according to whether the portion imaged by the latter imaging means is straight line or curved line. In this technology, it is possible to distinguish a main orientation flat from a plurality of sub orientation flats according to their sizes.

The technologies disclosed in the patent publications mentioned above are related to the distinguishment between front and rear surfaces of a semiconductor wafer using a main orientation flat and a sub orientation flat. Accordingly, they are based on the assumption that a main orientation flat is used for a pre-alignment. However, in the case where there are a plurality of orientation flats with the same size, it may be impossible to appoint any one of the orientation flats as an orientation flat for pre-alignment due to the same size of the orientation flats.

Hereinafter, a pre-alignment method which has been used for a semiconductor wafer having a plurality of orientation flats will be briefly described with reference to FIGS. 7a, 7b and 8. For example, as shown in FIG. 7a, when a semiconductor wafer W formed with three orientation flats is subjected to a pre-alignment process, semiconductor wafer W is disposed on a rotating body R for the pre-alignment, and is rotated by rotating body R. Herein, an orientation flat of semiconductor wafer W is detected by using an optical sensor having a light emitting element and a light receiving element, disposed in the neighborhood of rotating body R. When a light beam from the light emitting element passes through the outside of an orientation flat of rotating semiconductor wafer W, the light quantity of the light beam which passed through the outside is detected by the light receiving element. Herein, a control device determines the size of the orientation flat based on a detection signal of the light receiving element. As the light quantity detected by the light receiving element increases, the size of the orientation flat increases. These two values are in proportion to each other. FIG. 7b shows a graph illustrating the relationship between the detection position of the orientation flat and the light quantity detected by the light receiving element. In this graph, the horizontal axis denotes a coordinate position along the entire circumference of semiconductor wafer W, and the ordinate axis denotes a light quantity detected by the light receiving element. The peak area of the graph denotes the light quantity of a light beam which passed through the outside of the orientation flat of semiconductor wafer W, and corresponds to the area of a notch portion formed by the orientation flat. In a conventional pre-alignment, the largest orientation flat is used as a reference orientation flat for the pre-alignment.

Hereinafter, a conventional pre-alignment method will be described with reference to the flow chart illustrated in FIG. 8. First, the outer circumference of semiconductor wafer W is detected by the optical sensor to obtain data on the outer circumference of semiconductor wafer W (step S101). Then, eccentric components (an eccentric angle and an eccentricity amount) are calculated from the center of rotating body R with respect to the center of semiconductor wafer W based on the outer circumference data of semiconductor wafer W (step S102). Next, it is determined if the eccentricity amount is large (step S103). If the eccentricity amount is large, the eccentricity amount is corrected (step S104), and then the process proceeds back to step S101 to repeat the above described operations. When the eccentricity amount is corrected, it is determined that the center of semiconductor wafer W corresponds to the center of rotating body R in step S103, and then the number of orientation flats is detected by using the optical sensor (step S105). Also, as a method for calculating the eccentric components in step S102, Japanese Patent No. 2796296 discloses a method for employing a wafer in a pre-alignment method.

Then, based on the result detected by the optical sensor, it is determined if the number of the orientation flats is zero (step S106). If the number is determined not to be zero, the positions of the orientation flats are identified with reference to the data on the graph illustrated in FIG. 7b (step S107), and then the lengths of the respective orientation flats are calculated (step S108). Next, it is determined if an appointed flat No. is higher than the number of the orientation flats (step S109). If the appointed flat No. is not higher than the number of the orientation flats, the longest orientation flat is set as a reference orientation flat (step S110). After the setting of the reference orientation flat, orientation flats corresponding to the appointed flat No. with respect to the reference orientation flat are detected (step S111), the angle of rotating body R is set according to positions of the detected orientation flats (step S112), and the pre-alignment is finished. If the number of the orientation flats is zero in step S106, or if the appointed flat No. is higher than the number of the orientation flats in step S109, the process is determined to be in error, thereby stopping the alignment. Herein, the appointed flat No. denotes a parameter indicating a clockwise $n^{th}$ orientation flat from a reference orientation flat (or a reference circular arc) i.e., the first orientation flat. The angle should be adjusted to the $n^{th}$ orientation flat.

However, in a method for appointing a reference orientation flat based on the lengths of orientation flats, if there are a plurality of orientation flats with the same length, it was impossible to appoint the reference orientation flat for a pre-alignment on semiconductor wafer W due to the same length of the orientation flats.

SUMMARY

According to one embodiment, there is provided a method for appointing an orientation flat among a plurality of orientation flats as a reference orientation flat when pre-alignment for performing a predetermined treatment on a semiconductor wafer formed with the plurality of orientation flats is carried out. The method includes detecting each of the plurality of orientation flats by rotating the semiconductor wafer, obtaining a length of each of a plurality of circular arcs between the plurality of orientation flats, and setting a length of the longest circular arc from among the plurality of circular arcs, and appointing, as the reference orientation flat, an orientation flat next to the longest circular arc.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

FIGS. 1a and 1b are configuration views illustrating an example of a testing apparatus employing an orientation flat appointing method according to the present disclosure, in which FIG. 1a shows a front view illustrating a partially fractured prober chamber, and FIG. 1b shows a top view of it.

DETAILED DESCRIPTION

Figure 1A:
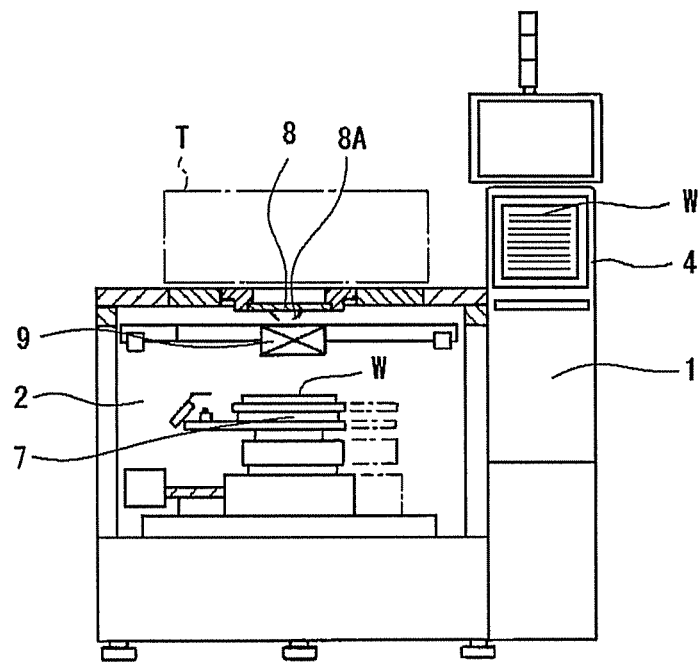

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

The present disclosure provides a method for appointing an orientation flat, an apparatus for detecting an orientation flat, and a program for appointing an orientation flat, in which even when there are a plurality of orientation flats with the same length, any one from among the orientation flats of the same length can be certainly appointed as a reference orientation flat.

According to one embodiment, there is provided a method for appointing an orientation flat among a plurality of orientation flats as a reference orientation flat when pre-alignment for performing a predetermined treatment on a semiconductor wafer formed with the plurality of orientation flats is carried out. The method includes detecting each of the plurality of orientation flats by rotating the semiconductor wafer, obtaining a length of each of a plurality of circular arcs between the plurality of orientation flats and setting a length of the longest circular arc from among the plurality of circular arcs, and appointing, as the reference orientation flat, an orientation flat next to the longest circular arc.

In the method according to one embodiment, the detecting the plurality of orientation flats may include detecting each of the orientation flats based on a detected light quantity of a light beam passing through outside of the plurality of orientation flats by using an optical sensor.

Also, the obtaining the lengths of the plurality of circular arcs may include detecting the lengths of the circular arcs of the semiconductor wafer based on a certain cut-off interval of the light quantity.

According to another embodiment, there is provided an apparatus for detecting an orientation flat. The apparatus may appoint an orientation flat among a plurality of orientation flats as a reference orientation flat when pre-alignment for performing a predetermined treatment on a semiconductor wafer formed with the plurality of orientation flats is carried out. The apparatus may include a rotating body to supportedly rotate the semiconductor wafer, an optical sensor to detect a light quantity of a light beam passing through outside of the orientation flats of the semiconductor wafer being rotated by the rotating body, and a control device to set a length of the longest circular arc of the semiconductor wafer based on a rotation amount of the rotating body during a period of time when the optical sensor does not detect a certain quantity of the light beam, and to appoint the reference orientation flat based on the length of the longest circular arc.

Also, in the apparatus, the control device may detect the plurality of orientation flats based on a quantity of light received by the optical sensor.

Also, the optical sensor may be disposed in the neighborhood of the rotating body, have a pair of a light emitting element and a light receiving element disposed above and below the semiconductor wafer, respectively, and detect the plurality of orientation flats based on a quantity of light detected by the light receiving element. The light receiving element detects the light emitting element's light beam passing through the outside of the plurality of orientation flats.

According to a further embodiment, there is provided a computer-readable recording medium storing a computer program for appointing an orientation flat, which when executed by a computer, causes the computer to perform the above described method.

The orientation flat appointing method, the orientation flat detecting apparatus, and the orientation flat appointing program, according to the present disclosure, can certainly appoint any one from among orientation flats of the same length as a reference orientation flat even when there are a plurality of orientation flats with the same length.

Hereinafter, an exemplary embodiment according to the present disclosure will be described with reference to FIGS. 1 to 6.

Figure 1B:
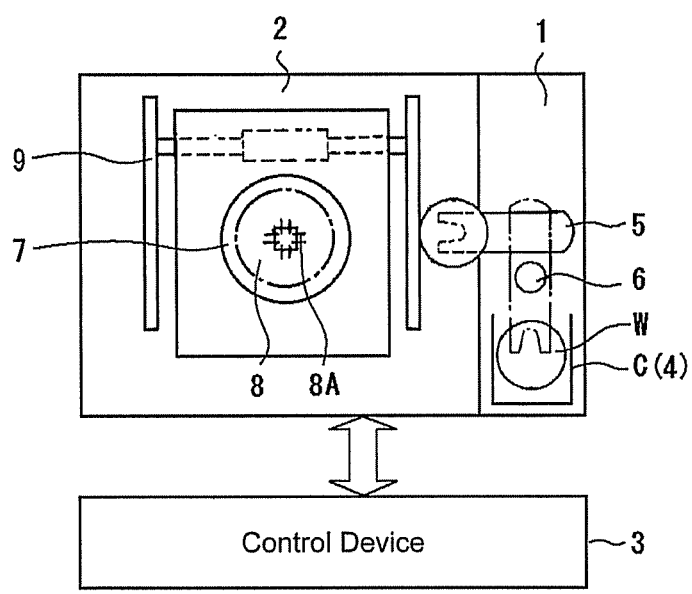

First, a testing apparatus used for executing an orientation flat appointing method according to one embodiment of the present disclosure will be described. This testing apparatus, as shown in FIG. 1, includes a loader chamber 1, a prober chamber 2, and a control device 3, in which the electrical properties of a plurality of devices formed on a semiconductor wafer W are tested in prober chamber 2. Loader chamber 1 receives to-be-tested objects (e.g., semiconductor wafers W) in a cassette unit, and carries semiconductor wafers W within a cassette C based on the test. Prober chamber 2 is adjacent to loader chamber 1, and tests electrical properties of semiconductor wafers W carried from loader chamber 1. Control device 3 controls a plurality of devices provided in each of loader chamber 1 and prober chamber 2.

Loader chamber 1 includes a receiving unit 4, a wafer carrying mechanism 5, and a pre-alignment mechanism 6. Receiving unit 4 receives a plurality of semiconductor wafers W in a cassette unit. Wafer carrying mechanism 5 loads and unloads semiconductor wafers W one by one to/from cassette C. Pre-alignment mechanism 6 performs pre-alignment of semiconductor wafer W. In loader chamber 1, under the control of control device 3, wafer carrying mechanism 5 draws out and transfers semiconductor wafer W from cassette C to pre-alignment mechanism 6, allows pre-alignment mechanism 6 to perform pre-alignment on semiconductor wafer W, and carries semiconductor wafer W from pre-alignment mechanism 6 to prober chamber 2. Also, wafer carrying mechanism 5 receives semiconductor wafer W which has been tested, from prober chamber 2, and loads it in its original position of cassette C.

Meanwhile, prober chamber 2 includes a movable seating unit 7 on which semiconductor wafer W is to be disposed, a probe card 8 which is disposed above seating unit 7 and has a plurality of probes 8A, and an alignment mechanism 9 which performs alignment on an electrode pad of semiconductor wafer W and the plurality of probes 8A. In prober chamber 2, under the control of control device 3, seating unit 7 receives semiconductor wafer W from wafer carrying mechanism 5, performs alignment on semiconductor wafer W and probe card 8 by association with alignment mechanism 9, and tests the electrical properties of the plurality of devices formed on semiconductor wafer W by electrically contacting the electrode pad of semiconductor wafer W with probes 8A of probe card 8. After the test, wafer carrying mechanism 5 receives semiconductor wafer W on seating unit 7.

Figure 2:
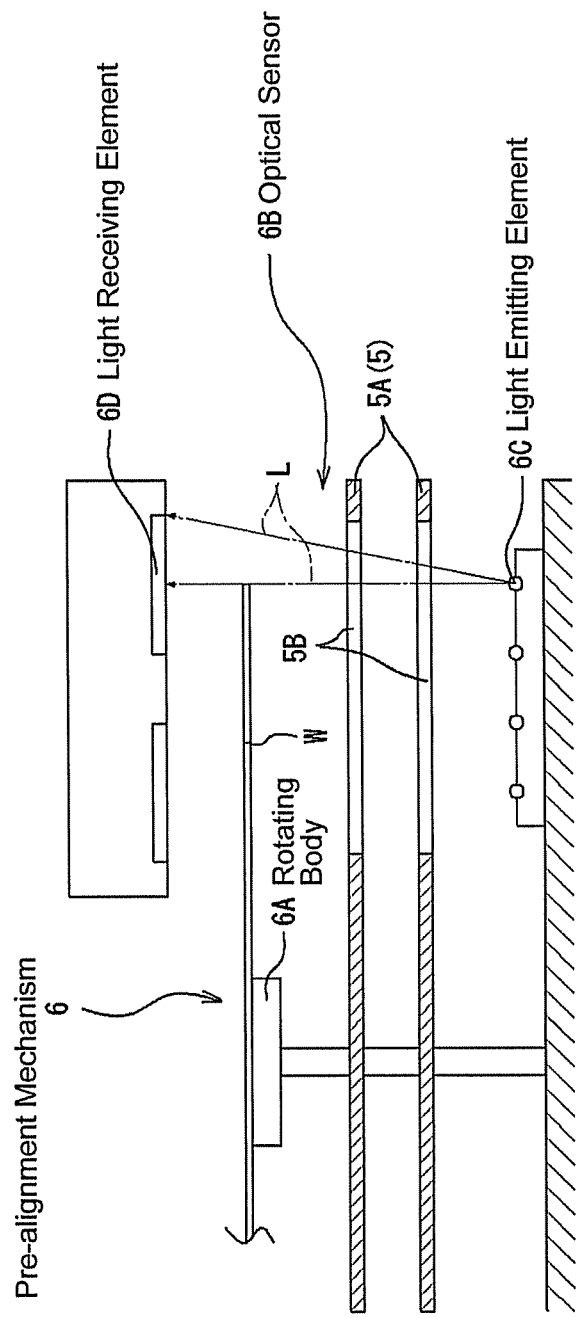
FIG. 2 is a cross-sectional view illustrating an orientation flat appointing apparatus according to an exemplary embodiment of the present disclosure, which is used in the testing apparatus shown in FIG. 1.

Then, an orientation flat detecting apparatus according to the present exemplary embodiment, as shown in FIGS. 1 and 2, includes pre-alignment mechanism 6 disposed within loader chamber 1, and control device 3 to control pre-alignment mechanism 6. As described above, the orientation flat detecting apparatus is configured to, under the control of control device 3, detect a plurality of orientation flats of semiconductor wafer W and the lengths of circular arcs between the plurality of orientation flats, and appoint a reference orientation flat during pre-alignment on semiconductor wafer W received from wafer carrying mechanism 5 in pre-alignment mechanism 6.

Wafer carrying mechanism 5, as shown in FIG. 2, has an upper-and-lower two-stage carrying arms 5A horizontally extending with a predetermined gap, and a driving means (not shown) to rotate and elevate carrying arms 5A, and is configured to carry semiconductor wafer W via upper-and-lower two-stage carrying arms 5A. Also, pre-alignment mechanism 6, as shown in FIG. 2, includes a rotating body 6A to support and rotate semiconductor wafer W, and an optical sensor 6B provided in the neighborhood of rotating body 6A, and is configured in such a manner that optical sensor 6B detects orientation flats of semiconductor wafer W on rotating body 6A, and performs pre-alignment on semiconductor wafer W, during the rotation of rotating body 6A supporting semiconductor wafer W.

As shown in FIG. 2, optical sensor 6B includes a light emitting element 6C disposed below semiconductor wafer W supported by rotating body 6A, and a light receiving element 6D disposed above semiconductor wafer W, which makes a pair with light emitting element 6C. Optical sensor 6B is configured in such a manner that, while a light beam L from light emitting element 6C passes through the outside of orientation flats of semiconductor wafer W during the rotation of semiconductor wafer W by rotating body 6A, light receiving element 6D detects the light quantity of light beam L, thereby detecting orientation flats of semiconductor wafer W. A plurality of light emitting elements 6C and a plurality of light receiving elements 6D are disposed in a diametric direction from the inside toward the outside of semiconductor wafer W. Through this disposition, even if semiconductor wafers W have different sizes, for example, 200 mm, 300 mm or the like, light emitting elements 6C and light receiving elements 6D can detect orientation flats of semiconductor wafers W, respectively. Also, carrying arms 5A of wafer carrying mechanism 5 have holes 5B formed therein, through which light beam L from light emitting element 6C passes.

Figure 3:
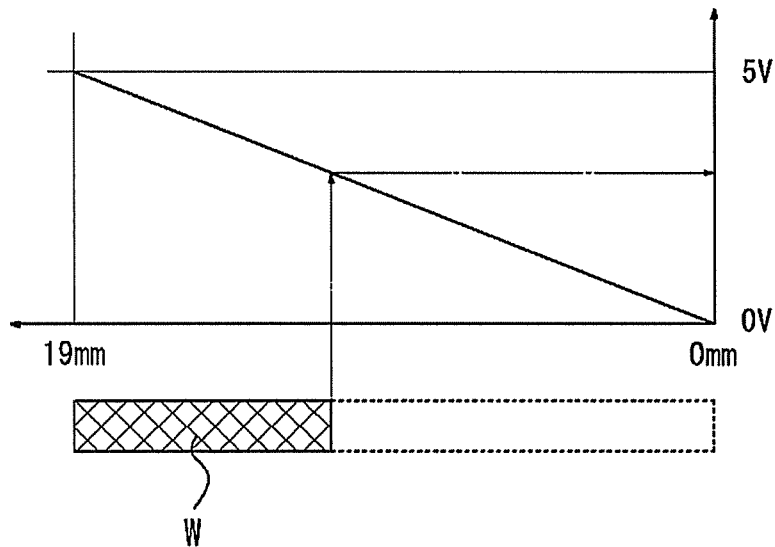
FIG. 3 is a graph showing the relationship between voltage and a light quantity received by a light receiving sensor used in the orientation flat appointing apparatus of the present disclosure.

For example, as shown in FIG. 3, the size of an orientation flat is in proportion to the quantity of light received by light receiving element 6D. In other words, in FIG. 3, the dashed portion of semiconductor wafer W indicates a notch portion of semiconductor wafer W, which is caused by an orientation flat. As the length of an orientation flat, that is, the area of the notch portion (caused by the orientation flat) of semiconductor wafer W, increases, the voltage based on the quantity of light received by light receiving element 6D increases. This proportional relationship may be used to determine the size of an orientation flat, and to further determine the length of the orientation flat.

In order to achieve the relationship shown in FIG. 3, the center of semiconductor wafer W and the center of rotating body 6A have to correspond to each other. When semiconductor wafer W is eccentrically disposed on rotating body 6A, the quantity of light received by light receiving element 6D changes according to the rotation of semiconductor wafer W, as shown as a wave form in the graph in FIG. 4. When there is no eccentricity in semiconductor wafer W, the quantity of light received by optical sensor 6B is fixed without a change. Accordingly, the eccentricity of semiconductor wafer W with respect to rotating body 6A is required to be corrected before the alignment of semiconductor wafer W such that the quantity of light received by optical sensor 6B is fixed. After the correction of eccentricity of semiconductor wafer W with respect to rotating body 6A, the reference orientation flat of semiconductor wafer W is appointed.

Then, control device 3 includes a central processing unit, a program storage unit storing various programs, such as a program for executing the orientation flat appointing method according to the present disclosure, and a memory unit recording various data, in which signals are transmitted and received among the central processing unit, the program storage unit, and the memory unit to control the devices in loader chamber 1 and prober chamber 2.

Figure 5A:
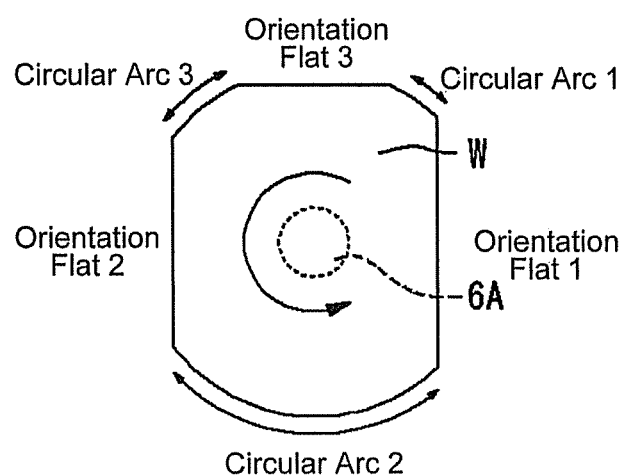
FIGS. 5a and 5b are illustrative views illustrating the principle of an orientation flat appointing method according to the present disclosure.

Hereinafter, the orientation flat appointing method according to the present exemplary embodiment, which is performed before the pre-alignment of semiconductor wafer W, will be described with reference to FIG. 5a. Semiconductor wafer W used in the present embodiment is the same as that described in the prior art. The present embodiment includes the steps of detecting orientation flats 1, 2, and 3 (see FIGS. 5a, and 5b) at three positions, respectively, by rotating semiconductor wafer W, calculating the lengths of three circular arcs 1, 2, and 3 between the orientation flats 1, 2, and 3 at the three positions, respectively, and appointing the orientation flat next to the longest circular arc 2 from among lengths of the three circular arcs 1, 2, and 3 (see FIGS. 5a, and 5b) as a reference orientation flat.

Figure 6:
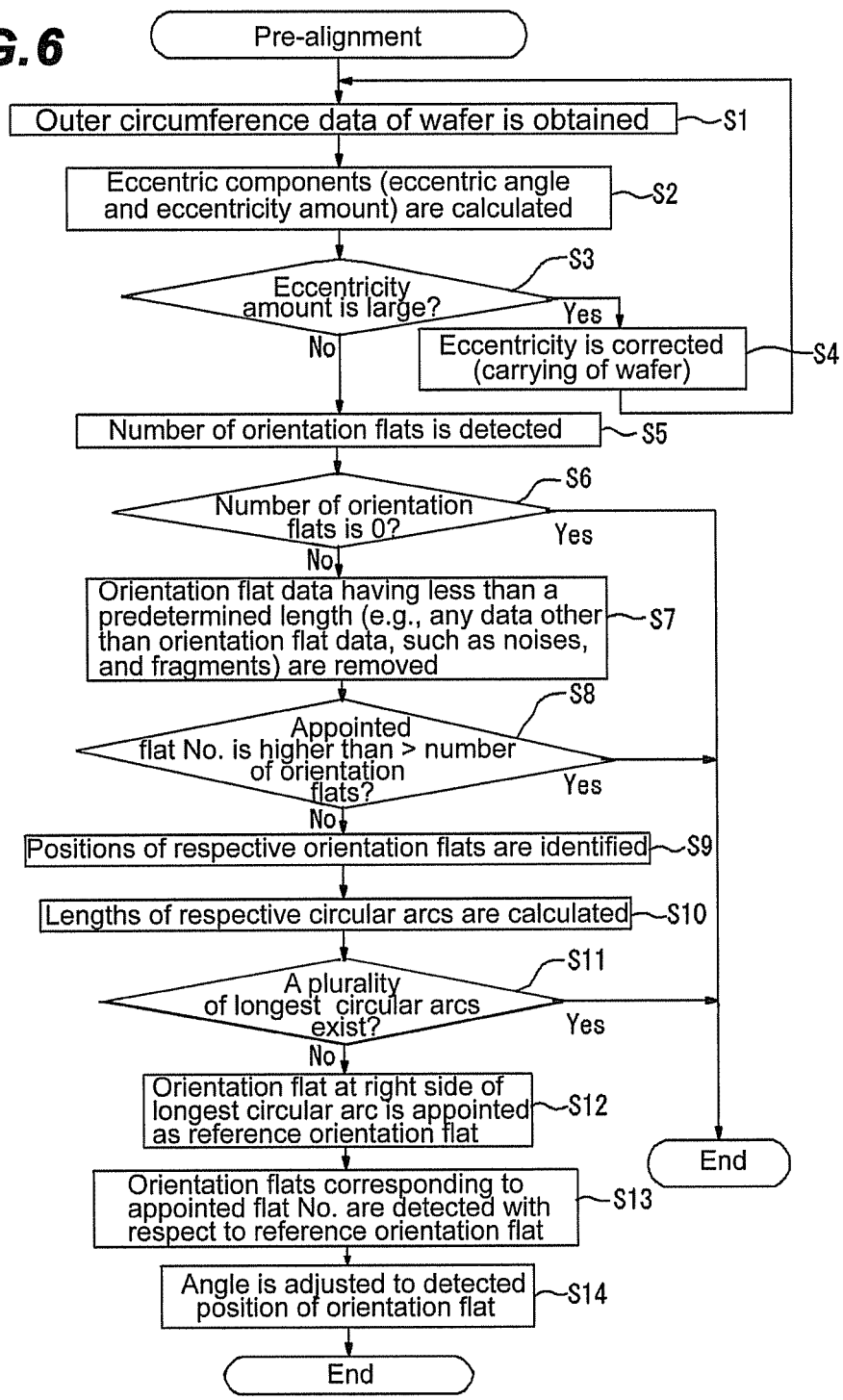
FIG. 6 is a flow chart illustrating an orientation flat appointing method according to an exemplary embodiment of the present disclosure.
Figure 7A:
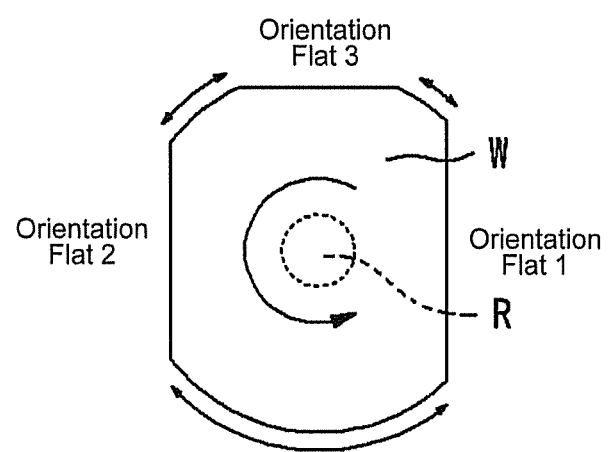
FIGS. 7a and 7b are illustrative views illustrating the principle of a conventional orientation flat appointing method.
Figure 7B:
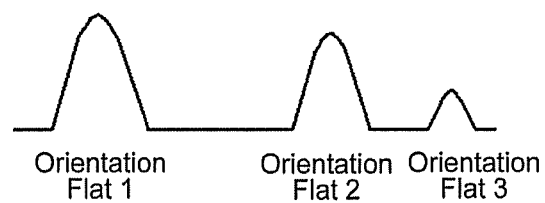
Figure 8:
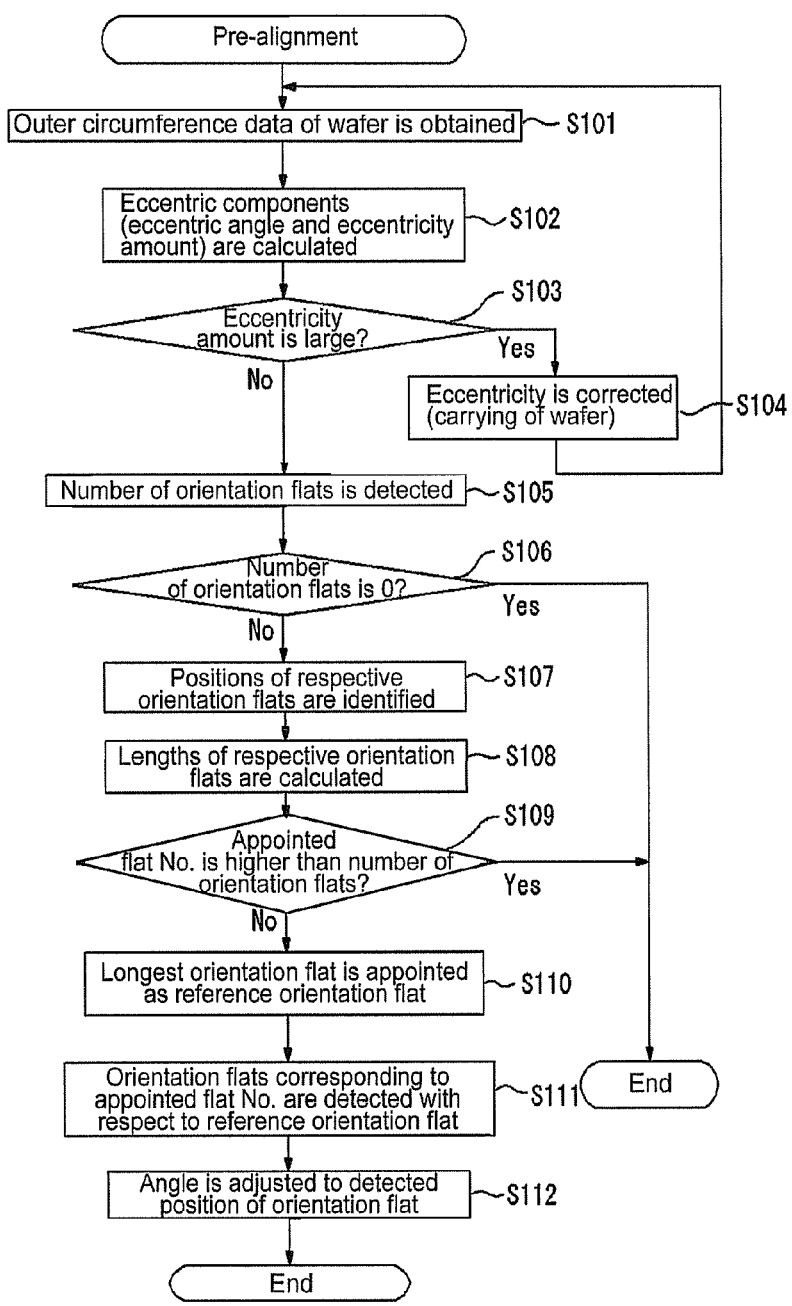
FIG. 8 is a flow chart illustrating an exemplary embodiment according to a conventional orientation flat appointing method.

Accordingly, in the execution of the above described orientation flat appointing method according to the present exemplary embodiment, when a computer (a control device) is driven, control device 3 allows the central processing unit, the program storage unit, and the memory unit to repeatedly transmit and receive signals to/from each other, thereby executing the respective steps illustrated in FIG. 6.

Figure 4:
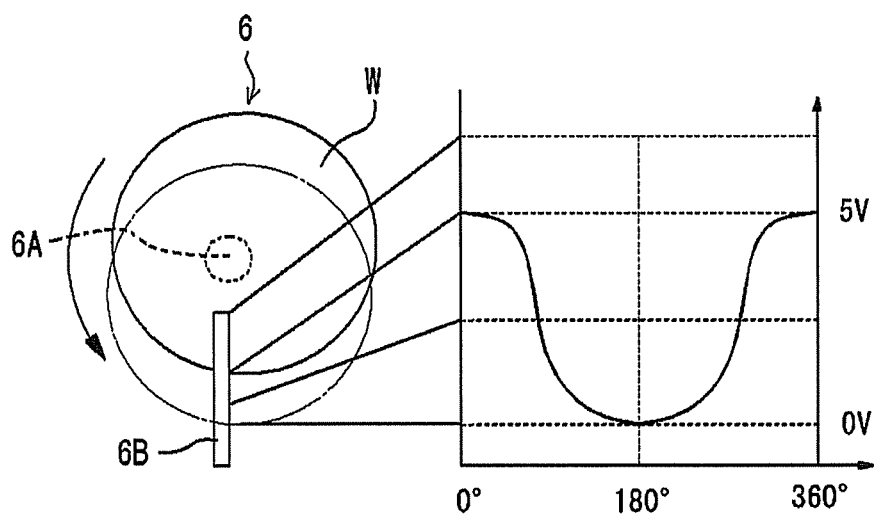
FIG. 4 is a graph showing the relationship between a rotation angle of a rotating body used in the orientation flat appointing apparatus of the present disclosure, and a voltage showing a light quantity received by a light receiving sensor on an eccentric semiconductor wafer.

In other words, as shown in FIG. 6, during the counter-clockwise rotation of semiconductor wafer W through rotating body 6A, the data on an outer circumference of semiconductor wafer W is obtained by using optical sensor 6B (step S1), and eccentric components of semiconductor wafer W with respect to rotating body 6A are calculated based on the data on the outer circumference of semiconductor wafer W (step S2). As shown in FIG. 4, the eccentric components are shown as wave components in a wave form, which are caused by the eccentricity of semiconductor wafer W. It is determined if the eccentric components calculated in step S2 are large (step S3). When the eccentric components are large, the eccentricity is corrected (step S4), and then the process proceeds back to step S1 to repeat the steps S1 to S3. When the eccentric amount is determined to have been corrected in step S3, the number of orientation flats is detected by using optical sensor 6B (step S5), and then it is determined if the number of orientation flats is zero (step S6). The steps S1 to S6 are performed according to the method described in the prior art, and the steps from step S7 to the last step significantly show the characteristics of the present exemplary embodiment.

If the number of orientation flats is determined not to be zero in step S6, some values less than a predetermined length of orientation flat (e.g., any data other than orientation flat data, such as noises, and fragments of a semiconductor wafer) are removed from orientation flat data so as to calculate an accurate length of a circular arc (step S7). Then, it is determined if an appointed flat No. is higher than the number of orientation flats (step S8). If the appointed flat No. is not higher than the number of orientation flats, the respective positions of the orientation flats 1, 2, and 3 (see FIG. 5a) are specified based on the peak positions shown in FIG. 5b (step S9), and then lengths of the circular arcs between the respective orientation flats 1, 2, and 3 are calculated [the straight line portions, except for the peaks, shown in FIG. 5b] (step S10).

Figure 5B:
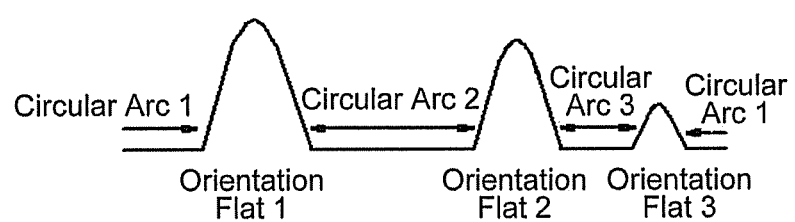

Hereinafter, the method for calculating the lengths of the circular arcs will be described. For example, as shown in FIG. 5b, the positions of peak points and the positions of both ends of peaks in the graph were already calculated as respective coordinate positions, and are stored as data of semiconductor wafer W in the memory unit. Accordingly, after designating, as the length of the entire circumference, the length from the position of the orientation flat on the far right to the position of the orientation flat on the far left based on this data, position coordinates of the respective peak points are sequentially searched for from the far left of the data. A position coordinate of a peak is determined to be an inflection point where the slope of position coordinate data changes from upward to downward. Position coordinates of both ends of a peak are determined to have position coordinate data existing in the lowest area by researching the leftward/rightward change of position coordinate data of a peak point.

As described above, it is determined if there is the longest circular arc in the three circular arcs 1, 2, and 3 based on the calculated data on the lengths of circular arcs (step S11). In FIG. 5, since there is the longest circular arc 2, the orientation flat 1 at the right side of the longest circular arc 2 is set as a reference orientation flat (step S12). Then, orientation flats are detected with respect to the reference orientation flat according to the appointed flat No. (step S13), and the angle of rotating body 6A is adjusted to the positions of the detected orientation flats (step S14), and the pre-alignment is finished.

Also, if the number of orientation flats is determined to be zero in step S6, if the appointed flat No. is higher than the number of orientation flats in step S8, or if there exist two or more longest circular arc lengths in step S11, the process is determined to be in error. Thus, the pre-alignment is stopped, generating a warning signal.

In the present exemplary embodiment as described above, an orientation flat detecting apparatus provided with rotating body 6A, optical sensor 6B, and control device 3 is used. Herein, rotating body 6A supports and rotates semiconductor wafer W, and optical sensor 6B detects the light quantity of light beam L passing through the outside of a plurality of orientation flats of semiconductor wafer W rotated by rotating body 6A. Control device 3 sets the longest circular arc length of semiconductor wafer W based on the rotation amount of rotating body 6A while optical sensor 6B does not detect a predetermined amount of light beam L, and appoints a reference orientation flat based on the longest circular arc length. Using the orientation flat detecting apparatus, three orientation flats 1, 2, and 3 at three positions are detected, respectively, through the rotation of semiconductor wafer W, the lengths of three circular arcs 1, 2, and 3 between the three orientation flats 1, 2, and 3 are obtained, respectively, and then an orientation flat at the right side of the longest circular arc 2, from among the three circular arcs 1, 2, and 3, is appointed as a reference orientation flat (step S12). Accordingly, it is possible to certainly appoint a reference orientation flat even though there exist a plurality of circular arcs with the same length.

Also, according to the present exemplary embodiment, since optical sensor 6B is used to detect orientation flats, respectively, by detecting the light quantity of light beam L passing through the outside of three orientation flats 1, 2, and 3, it is possible to certainly detect the sizes of the orientation flats 1, 2, and 3. Also, since the length of the circular arc of semiconductor wafer W is detected based on the interval where the quantity of light detected by optical sensor 6B is cut off, it is possible to certainly detect the lengths of the respective circular arcs 1, 2, and 3.

Also, the present disclosure is not limited to the above described exemplary embodiment, and the designs of configuration elements may be appropriately changed as required. For example, in the above described embodiment, the present disclosure is applied to a testing apparatus, but may be applied to a semiconductor wafer processing apparatus as well as the testing apparatus.

The present disclosure may be appropriately used for processing apparatuses, including a testing apparatus of a semiconductor wafer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A method for appointing an orientation flat as a reference orientation flat in a semiconductor wafer formed with a plurality of orientation flats when a pre-alignment process is carried out for performing a predetermined treatment on the semiconductor wafer using and apparatus including an optical sensor, a rotating body and a control device, the method comprising:
   detecting each of the plurality of orientation flats using the optical sensor by rotating the semiconductor wafer using the rotating body;
   obtaining a length for each of a plurality of circular arcs formed between the plurality of orientation flats detected at the detecting using the control device; and
   identifying a length of the longest circular arc among the plurality of circular arcs obtained at the obtaining, and appointing an orientation flat next to the longest circular arc as the reference orientation flat based on the length of the longest circular arc using the control device.

2. The method as claimed in claim 1, wherein said detecting the plurality of orientation flats comprises detecting each of the orientation flats based on a detected light quantity of a light beam passing through the outside of the plurality of orientation flats by using the optical sensor.

3. The method as claimed in claim 2, wherein said obtaining the lengths of the plurality of circular arcs comprises detecting the lengths of the circular arcs of the semiconductor wafer based on a certain cut-off interval of the light quantity.

4. An apparatus for appointing an orientation flat as a reference orientation flat in a semiconductor wafer formed with a plurality of orientation flats when a pre-alignment process is carried out for performing a predetermined treatment on the semiconductor wafer, the apparatus comprising;
   a rotating body configured to support and rotate the semiconductor wafer;
   an optical sensor configured to detect a light quantity of a light beam passing through the outside of the orientation flats of the semiconductor wafer being rotated by the rotating body, thereby detecting the plurality of orientation flats in the semiconductor wafer; and
   a control device including a processor and configured to control an overall operation of the apparatus including the rotating body and the optical sensor,
   wherein the control device is programmed such that a length for each of a plurality of circular arcs formed between the plurality of orientation flats is obtained, a length of the longest circular arc of the semiconductor wafer is identified based on a rotation amount of the rotating body during a period of time when the optical sensor does not detect a certain quantity of the light beam, and the reference orientation flat is appointed based on the length of the longest circular arc.

5. The apparatus as claimed in claim 4, wherein the optical sensor is disposed in the neighborhood of the rotating body, has a light emitting element and a light receiving element disposed above and below the semiconductor wafer, respectively, and detects the plurality of orientation flats based on a quantity of light detected by the light receiving element, the light receiving element detecting the light emitting element's light beam passing through the outside of the plurality of orientation flats.

6. A non-transitory computer-readable recording medium storing a computer program for appointing an orientation flat, which when executed by a computer, causes the computer to perform the method as claimed in claim 1.

* * * * *